United States Patent
Kajigaya

(10) Patent No.: US 9,514,792 B2
(45) Date of Patent: Dec. 6, 2016

(54) SEMICONDUCTOR DEVICE HAVING STACKED LAYERS

(75) Inventor: Kazuhiko Kajigaya, Tokyo (JP)

(73) Assignee: Longitude Semiconductor S.a.r.l., Luxembourg (LU)

(*) Notice: Subject to any disclaimer, the term of this patent is extended or adjusted under 35 U.S.C. 154(b) by 866 days.

(21) Appl. No.: 13/610,949

(22) Filed: Sep. 12, 2012

(65) Prior Publication Data

US 2013/0070506 A1 Mar. 21, 2013

(30) Foreign Application Priority Data

Sep. 15, 2011 (JP) ................. 2011-202466

(51) Int. Cl.
*G11C 5/02* (2006.01)
*G11C 7/18* (2006.01)
*G11C 11/4076* (2006.01)
*G11C 11/4097* (2006.01)

(52) U.S. Cl.
CPC ............. *G11C 7/18* (2013.01); *G11C 11/4076* (2013.01); *G11C 11/4097* (2013.01)

(58) Field of Classification Search
CPC ..... G11C 7/18; G11C 11/4076; G11C 11/4097
See application file for complete search history.

(56) References Cited

U.S. PATENT DOCUMENTS

| | | | |
|---|---|---|---|
| 5,138,437 A * | 8/1992 | Kumamoto | H01L 27/0688 257/686 |
| 6,822,916 B2 | 11/2004 | Frey et al. | |
| 7,052,941 B2 | 5/2006 | Lee | |
| 8,169,826 B2 | 5/2012 | Hishida et al. | |
| 8,189,413 B2 | 5/2012 | Yoshida | |
| 8,426,976 B2 | 4/2013 | Ishiduki et al. | |
| 8,619,471 B2 * | 12/2013 | Tanzawa | ................ 365/185.18 |
| 2001/0030884 A1 | 10/2001 | Frey et al. | |
| 2004/0262635 A1 | 12/2004 | Lee | |
| 2009/0230458 A1 | 9/2009 | Ishiduki et al. | |

(Continued)

FOREIGN PATENT DOCUMENTS

JP 2001298166 A 10/2001
JP 2002026283 A 1/2002

(Continued)

OTHER PUBLICATIONS

Ryota Katsumata, et al. "Pipe-shaped BiCS Flash Memory with 16 Stacked Layers and Multi-Level-Cell Operation for Ultra High Density Storage Devices" Symposium on VLSI Technology Digest of Technical Papers, pp. 136-137 (2009).

(Continued)

*Primary Examiner* — Richard Elms
*Assistant Examiner* — Mohammed A Bashar

(57) ABSTRACT

A semiconductor device is disclosed in which there are provided a first substrate including memory cells and at least one bit line electrically coupled to the memory cells, and a second substrate including a sense amplifier. Each of the memory cells includes a first transistor, and the sense amplifier includes a second transistor. The second substrate is stacked with the first substrate such that the sense amplifier amplifies data transferred through the bit line from a selected one of the memory cells. The first transistor is lower in carrier mobility than the second transistor.

10 Claims, 19 Drawing Sheets

(56) References Cited

U.S. PATENT DOCUMENTS

| | | | |
|---|---|---|---|
| 2009/0307415 A1* | 12/2009 | Kang et al. | 711/103 |
| 2011/0013454 A1 | 1/2011 | Hishida et al. | |
| 2011/0141821 A1* | 6/2011 | Izumi | H01L 27/115 365/185.23 |
| 2011/0156027 A1 | 6/2011 | Yamazaki et al. | |
| 2013/0256657 A1 | 10/2013 | Yamazaki et al. | |

FOREIGN PATENT DOCUMENTS

| | | | |
|---|---|---|---|
| JP | 2006155750 A | 6/2006 | |
| JP | 2007525004 A | 8/2007 | |
| JP | 2009224466 A | 10/2009 | |
| JP | 2010055697 A | 3/2010 | |
| JP | 2011040706 A | 2/2011 | |
| JP | 201196950 A | 5/2011 | |
| JP | 2011151383 A | 8/2011 | |

OTHER PUBLICATIONS

Jiyoung Kim, et al. "Novel Vertical-Stacked-Array-Transistor (VSAT) for ultra-high-density and cost-effective NAND Flash memory devices and SSD (Solid State Drive)" Symposium on VLSI Technology Digest of Technical Papers, pp. 186-187 (2009).

Wonjoo Kim, et al. "Multi-Layered Vertical Gate NAND Flash Overcoming Stacking Limit for Terabit Density Storage" Symposium on VLSI Technology Digest of Technical Papers, pp. 188-189 (2009).

Jaehoon Jang, et al. "Vertical Cell Array using TCAT (Terabit Cell Array Transistor) Technology for Ultra High Density NAND Flash Memory" Symposium on VLSI Technology Digest of Technical Papers, pp. 192-193 (2009).

Hang-Ting Lue, et al. "A Highly Scalable 8-Layer 3D Vertical-Gate (VG) TFT NAND Flash Using Junction-Free Buried Channel BE-SONOS Device" IEEE Symposium on VLSI Technology Digest of Technical Papers, pp. 131-132 (2010).

Sungjin Whang, et al. "Novel 3-Dimensional Dual Control-Gate with Surrounding Floating-Gate (DC-SF) NAND Flash Cell for 1Tb File Storage Application" IEEE IEDM10-668-671, pp. 29.7.1-29.7.4 (2010).

Monolithic 3D, Inc. Technology Breakthrough, Monolithic 3D DRAM.

Monolithic 3D, Inc. Technology Breakthrough, Monolithic 3D NAND Flash Memory.

Monolithic 3D, Inc. Technology Breakthrough, Monolithic 3D Non-Volatile Memory: RRAM, PCM.

\* cited by examiner

FIG. 3
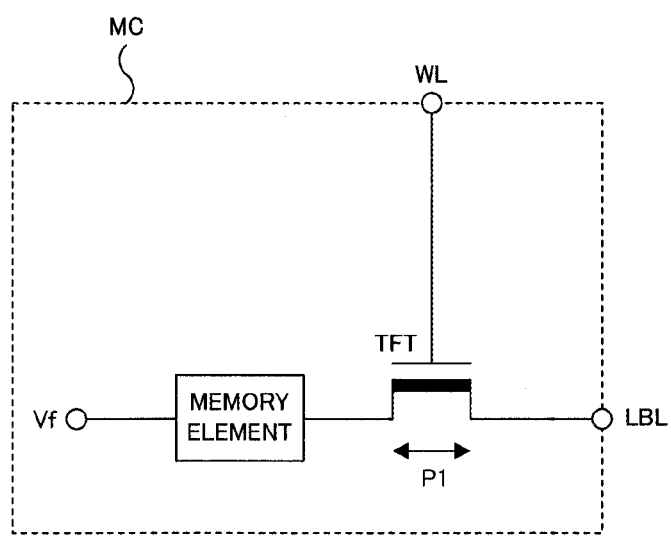
(1) 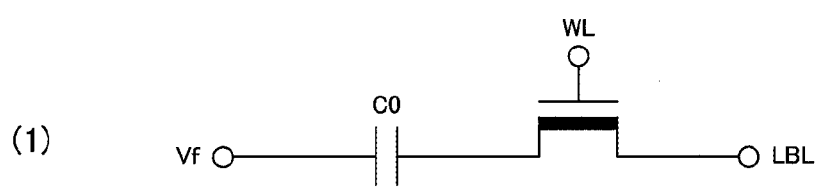
(2) 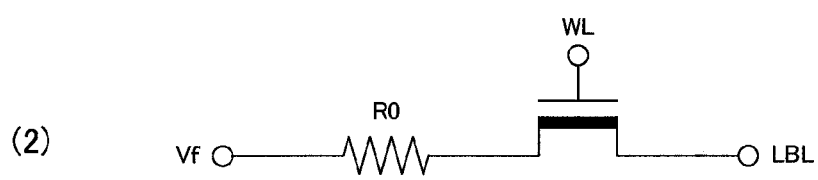

FIG. 4
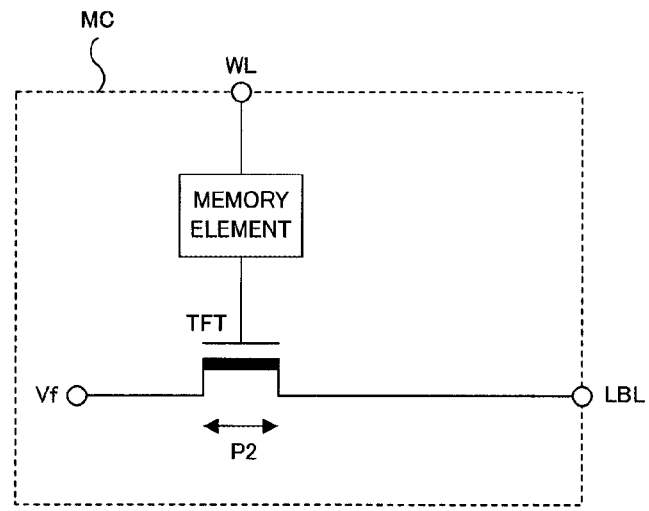
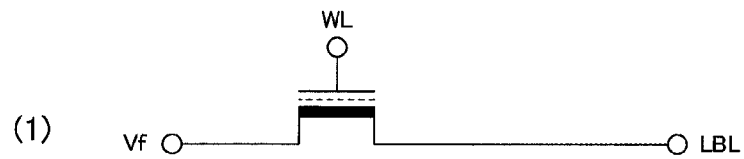
(1)
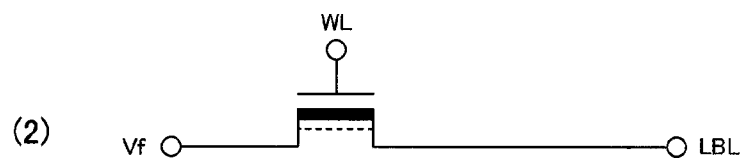
(2)
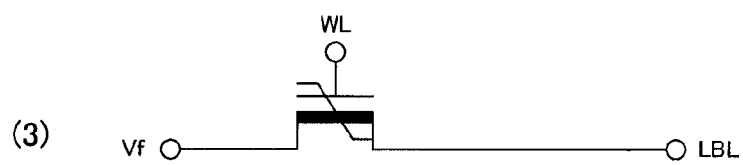
(3)
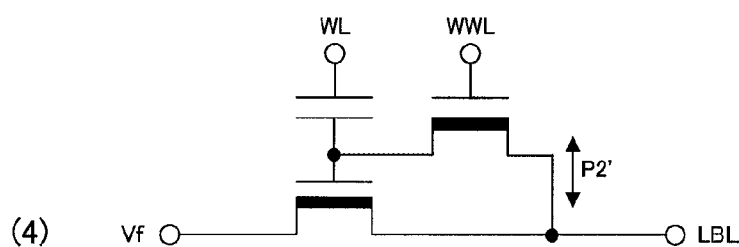
(4)

FIG. 5
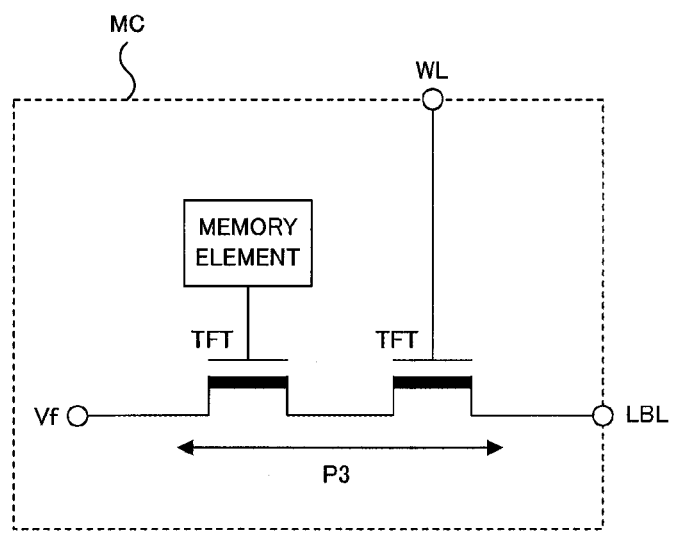
(1)
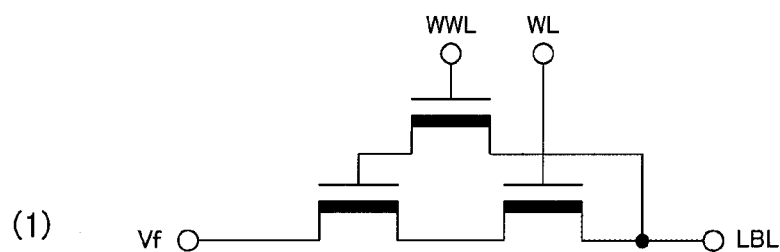

SEMICONDUCTOR DEVICE HAVING STACKED LAYERS

BACKGROUND OF THE INVENTION

Field of the Invention

The present invention relates to a semiconductor device in which TFTs are formed in layers stacked on a substrate.

Description of Related Art

Semiconductor devices of recent years have employed a stacked-type memory cell array having a multilayer structure on a substrate in order to deal with an increase in capacity and a reduction in size. Attention has been focused on a technique for forming a transistor in such a memory cell array, in which semiconductor material capable of being stacked in a low temperature process such as polysilicon or oxide semiconductor is used to form a channel. For example, a structure has been proposed which includes a transistor in which the polysilicon is used as the channel in a stacked-type NAND flush memory (for example, see Non-Patent References 1 to 6). Further, for example, a structure has been proposed in which a stacked-type DRAM, NAND flush memory, or ReRAM/PCRAM is formed by attaching monocrystalline silicon layers to one another and stacking them (see Non-Patent References 7 to 9).

[Non-Patent Reference 1] Ryota Katsumata, et al. "Pipe-shaped BiCS Flash Memory with 16 Stacked Layers and Multi-Level-Cell Operation for Ultra High Density Storage Devices" Symposium on VLSI Technology Digest of Technical Papers, pp. 136-137 (2009).

[Non-Patent Reference 2] Jiyoung Kim, et al. "Novel Vertical-Stacked-Array-Transistor (VSAT) for ultra-high-density and cost-effective NAND Flash memory devices and SSD (Solid State Drive)" Symposium on VLSI Technology Digest of Technical Papers, pp. 186-187 (2009).

[Non-Patent Reference 3] Wonjoo Kim, et al. "Multi-Layered Vertical Gate NAND Flash Overcoming Stacking Limit for Terabit Density Storage" Symposium on VLSI Technology Digest of Technical Papers, pp. 188-189 (2009).

[Non-Patent Reference 4] Jaehoon Jang, et al. "Vertical Cell Array using TCAT (Terabit Cell Array Transistor) Technology for Ultra High Density NAND Flash Memory" Symposium on VLSI Technology Digest of Technical Papers, pp. 192-193 (2009).

[Non-Patent Reference 5] Hang-Ting Lue, et al. "A Highly Scalable 8-Layer 3D Vertical-Gate (VG) TFT NAND Flash Using Junction-Free Buried Channel BE-SONOS Device" IEEE Symposium on VLSI Technology Digest of Technical Papers, pp. 131-132 (2010).

[Non-Patent Reference 6] Sungj in Whang, et al. "Novel 3-Dimensional Dual Control-Gate with Surrounding Floating-Gate (DC-SF) NAND Flash Cell for 1Tb File Storage Application" IEEE IEDM10-668-671, pp. 29.7.1-29.7.4 (2010).

[Non-Patent Reference 7] Monolithic 3D, Inc. Technology Breakthrough, Monolithic 3D DRAM

[Non-Patent Reference 8] Monolithic 3D, Inc. Technology Breakthrough, Monolithic 3D NAND Flash Memory

[Non-Patent Reference 9] Monolithic 3D, Inc. Technology Breakthrough, Monolithic 3D Non-Volatile Memory: RRAM, PCM When applying the above conventional techniques to a memory, it is difficult to ensure a high-speed operation. That is, in the structure disclosed in the above Non-Patent References 1 to 6, the polysilicon in which carrier mobility is smaller compared with monocrystal channel is used as the channel of a transistor, which reduces its conductance. Therefore, on-current of the transistor becomes small and the high-speed operation is hindered. Further, in the technique disclosed in the above Non-Patent References 7 to 9, a process needs to be added when manufacturing a semiconductor memory, in which a monocrystalline silicon wafer having an oxide film and ion-implanted with hydrogen is formed into a thin film and the film, is stacked, thereby increasing manufacturing cost.

SUMMARY

A semiconductor device according to an embodiment of the disclosure comprises: a first semiconductor layer including a plurality of memory cells and at least one bit line electrically coupled to the memory cells, each of the memory cells including a first transistor; and a second semiconductor layer including a sense amplifier, the sense amplifier including a second transistor, the second semiconductor layer being stacked with the first semiconductor layer such that the sense amplifier amplifies data that is transferred through the bit line from a selected one of the memory cells. In the semiconductor device, the first transistor is lower in carrier mobility than the second transistor.

A semiconductor device according to an embodiment of the disclosure comprises: a plurality of first semiconductor layers, each of the first semiconductor layers including a plurality of memory cells and a plurality of bit lines each electrically coupled to associated one or ones of the memory cells, the first semiconductor layers being stacked with each other to provide a stacked structure in which each of the bit lines of a lower one of the first semiconductor layers are electrically connected to an associated one of the bit lines of an upper one of the semiconductor layers; a second semiconductor layer including at least one sense amplifier, the sense amplifier including a second transistor that is higher in carrier mobility than the first transistor; and a third semiconductor layer including at least one selection circuit, the selection circuit including a third transistor that is lower in carrier mobility than the second transistor, the third semiconductor layer being sandwiched between the stacked structure and the second semiconductor layer such that the selection circuit electrically connects the sense amplifier of the second semiconductor layer to a selected one of the bit lines of a lowermost of the first semiconductor layers.

BRIEF DESCRIPTION OF THE DRAWINGS

FIG. 3 is a diagram showing a first configuration example of a memory cell of the embodiment;

FIG. 4 is a diagram showing a second configuration example of the memory cell of the embodiment;

FIG. 5 is a diagram showing a third configuration example of the memory cell of the embodiment;

DETAILED DESCRIPTION OF THE PREFERRED EMBODIMENTS

Figure 1:
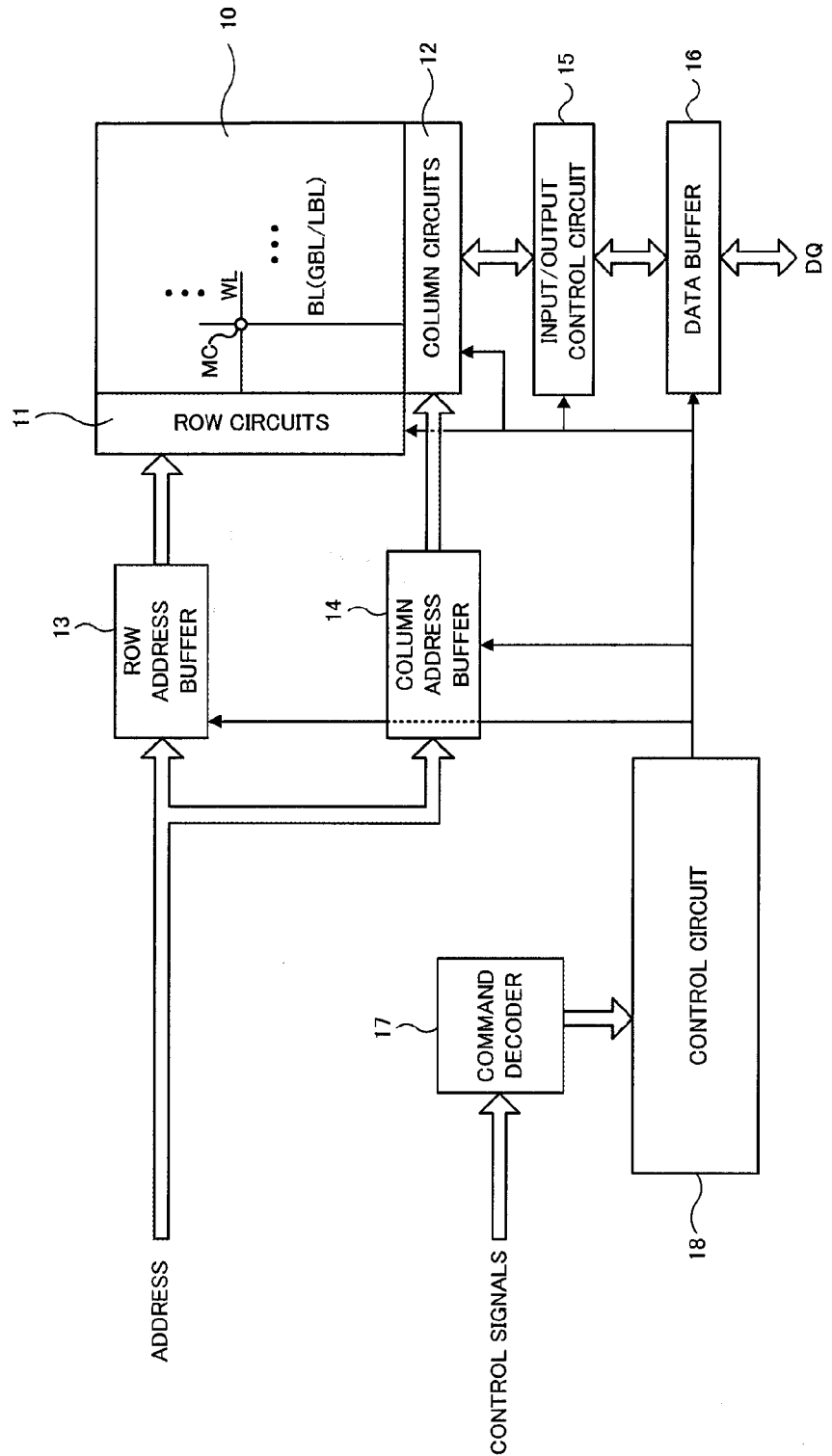
FIG. 1 is a block diagram showing an entire configuration of a semiconductor device of an embodiment.

In the following, preferred embodiments of the invention will be described in detail with reference to accompanying drawings. FIG. 1 is a block diagram showing an entire configuration of a semiconductor device of an embodiment, which shows, for example, a configuration example of a volatile DRAM (Dynamic Random Access Memory). In the semiconductor device shown in FIG. 1, there are provided a memory cell array 10 including a plurality of memory cells MC each storing data, and row circuits 11 and column circuits 12 that are attached to the memory cell array 10. The row circuits 11 include circuits provided corresponding to a plurality of word lines WL, and the column circuits 12 include circuits provided corresponding to a plurality of bit lines BL. It is preferred that the memory cell array 10 has a hierarchical bit line structure, and in this embodiment, the bit lines BL are hierarchized into local bit lines LBL of a lower hierarchy and global bit lines GEL of an upper hierarchy. Each of the memory cells MC includes a TFT (Thin Film Transistor). The TFT is one type of FETs (Field Effect Transistors). The TFT is basically a three-terminal device having a source terminal, a drain terminal and a gate terminal, and does not have a back-gate terminal. Although various structures of the TFT are known, the TFT of the embodiments may be a transistor having three electrodes. An example of such a structure includes a gate layer (gate electrode), a channel layer facing the gate layer via an insulation layer, a source electrode connected to one end of the channel layer, and a drain electrode connected to the other end of the channel layer.

An externally input address includes a row address and a column address. The row address is stored in a row address buffer 13 and sent to the row circuits 11. The column address is stored in a column address buffer 14 and sent to the column circuits 12. Data transfer between the column circuits 12 and a data buffer 16 is controlled by an input/output control circuit 15, and the data is transferred from/to outside via input/output data terminals (DQ). A command decoder 17 determines a command for the DRAM based on externally input control signals and sends the command to a control circuit 18. The control circuit 18 controls operations of respective parts of the DRAM in accordance with a command type determined by the command decoder 17.

Figure 2:
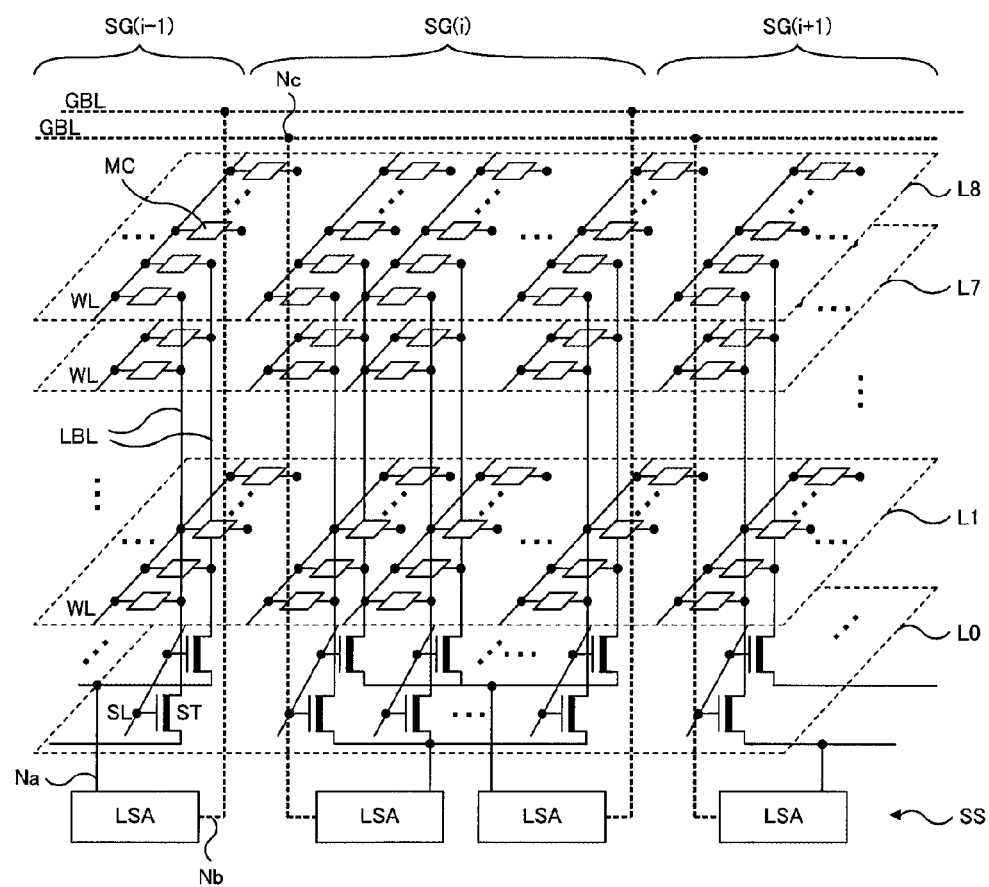
FIG. 2 is a diagram schematically showing a main part of a memory cell array in the semiconductor device of the embodiment.

FIG. 2 schematically shows a main part of the memory cell array 10 in the semiconductor device of the embodiment. In FIG. 2, partial structures of the memory cell array 10 are shown layer by layer in a multilayer structure of the semiconductor device. As shown in the lower part of FIG. 2, three directions X, Y and Z are represented by arrows for the convenience of descriptions. The X direction and the Y direction match two directions perpendicular to each other in a plane of each layer, and the Z direction matches a stacking direction (vertical direction) of each layer.

A plurality of global bit lines GBL extending in the X direction are arranged over the multilayer structure shown in FIG. 2. The memory cell array 10 is divided along the direction of the global bit lines GBL into a plurality of segments SG. FIG. 2 shows a range of an i-th segment SG(i) of N segments and partially shows two segments SG(i−1) and SG (i+1) adjacent to the segment SG(i). Further, in the multilayer structure of FIG. 2, eight-layer TFT cell layers L1 to L8 and an underlying TFT selection circuit layer L0 are respectively arranged. Circuits using TFTs (the first transistors) are formed on the TFT cell layers L1 to L8 (the first layers) and the TFT selection circuit layer L0 (the second layer), respectively. Furthermore, a silicon substrate SS including MOSFETs (the second transistors) formed on a monocrystalline silicon is arranged under The TFT cell layers L1 to L8 and the TFT selection circuit layer L0. The silicon substrate SS is a basic layer over which the first and second layers are stacked. The global bit lines GEL are formed in an upper layer (the third layer) over the TFT cell layers L1 to L8.

In the embodiments, the TFT selection circuit layer L0, the TFT cell layers L1 to L8, and the upper layer for the global bit lines GLB may be a layer or substrate, respectively.

A plurality of word lines WL extending in the Y direction and a plurality of memory cells MC having one terminals connected to the word lines WL are respectively formed on each of the TFT cell layers L1 to L8. In one segment SG, there are J word lines WL arranged in the X direction on each layer, and thus there are 8J word lines WL in total on the eight-layer TFT cell layers L1 to L8. Further, when viewed along the stacking direction, the memory cells MC are located near intersections of the global bit lines GEL and the word lines WL. In addition, each of the memory cells MC includes a memory element and a TFT, and specific configuration examples thereof will be described later.

The other terminals of the memory cells MC are connected to local bit lines LBL (the first bit lines) extending in the Z direction. Each of the local bit lines LBL is shared by eight memory cells MC located at the same position along the stacking direction, and has one end connected to a drain of a switch transistor ST (the third transistor) of the TFT selection circuit layer L0. The switch transistor ST has a gate connected to a LBL selecting line SL and a source connected to one input/output node Na of a local sense amplifier LSA (the first circuit) on the silicon substrate SS, and functions as the selection circuit. In this case, the eight memory cells MC and one switch transistor ST are aligned in the Z direction. The switch transistor ST is included in the memory cell array 10, and a signal of the LBL selecting line SL connected to the gate thereof is generated by the row circuits 11 (FIG. 1). Thereby, one of J local bit lines LBL arranged in the X direction that is selected according to an address is selectively connected to the local sense amplifier LSA. That is, as shown in FIG. 2, respective sources of the J switch transistors ST aligned in the X direction are connected to the input/output node Na of each local sense amplifier LSA. That is, each local sense amplifier LSA is shared by the J local bit lines LBL arranged in the X direction, and signals of 8J memory cells MC in total can be selectively read out.

Further, the other input/output node Nb of each local sense amplifier LSA is connected to the global bit line GBL. That is, each global bit line GBL extending in the X direction is branched at a node Nc of the segment SG and extends from the node Nc to the silicon substrate SS along the Z direction, and its lower end is connected to the input/output node Nb of the local sense amplifier LSA. This structure enables the local sense amplifier LSA to sense and amplify the signal on a selected local bit line LBL through one input/output node Na and to output the signal to the global bit line GBL through the other input/output node Nb. In addition, a specific circuit configuration of the local sense amplifier LSA will be described later.

Here, specific configuration examples of the memory cell MC included in the memory cell array 10 of FIG. 2 will be described with reference to FIGS. 3 to 5. The memory cell MC of the embodiments includes one memory element and at least one TFT, and the TFT is configured to be inserted in a read current path. FIG. 3 shows a configuration example of a memory cell MC in which the memory element and the TFT are inserted in the read current path. That is, as shown in the upper part of FIG. 3, the memory cell MC has a structure in which the memory element and the TFT are series connected in a read current path P1 between a fixed voltage Vf and the local bit line LBL and the gate of the TFT is connected to the word line WL. Specific examples of the memory cell MC of this type are shown in FIGS. 3(1) and 3(2). The memory cell MC of FIG. 3(1) is a 1T1C type DRAM cell including a capacitor C0 used as the memory element. The memory cell MC of FIG. 3(2) is a 1T1R type ReRAM cell including a resistance change-type element R0 (hereinafter, simply referred to as resistance R0) used as the memory element.

FIG. 4 shows a configuration example of a memory cell MC in which the gate of the TFT is connected to the memory element. That is, as shown in the upper part of FIG. 4, the memory cell MC has a structure in which the TFT is inserted in a read current path P2 between the fixed voltage Vf and the local bit line LBL and the memory element is connected between the gate of the TFT and the word line WL. Specific examples of the memory cell MC of this type are shown in FIGS. 4(1) to 4(4). The memory cell MC of FIG. 4(1) is a cell including a charge trap formed in a gate insulation film of the TFT. The memory cell MC of FIG. 4(2) is a floating body type cell that stores electric charge in the channel side of the TFT. The memory cell MC of FIG. 4(3) is a 1T type FeRAM cell in which the TFT has a gate insulation film formed with a ferroelectric film. The memory cell MC of FIG. 4(4) is a 2T1C type DRAM cell in which a capacitor is inserted between the gate of the TFT and the word line WL, another write path P2' is formed between the gate of the TFT and the local bit line LBL, and a second TFT having a gate connected to a word line WWL for writing is inserted in the write path P2'. In each of the memory cells MC of FIGS. 4(1) to 4(3), the first transistor is integrally formed by the memory element storing data and the TFT inserted in the current path. The memory cells MC FIGS. 4(1) to 4(3) can be configured like NAND strings. For example, by series-connecting a plurality of memory cells MC (the source of one memory cell MC is connected to the drain of the other memory cell MC), the source of one memory cell MC at one end can be connected to one local bit line LBL.

FIG. 5 shows a configuration example of a memory cell MC including one TFT whose gate is connected to the memory element and the other TFT whose gate is connected to the word line WL. That is, as shown in the upper part of FIG. 5, the memory cell MC has a structure in which two TFTs are inserted in a read current path P3 between the fixed voltage Vf and the local bit line LBL, the memory element is connected to the gate of the one TFT (left side) and the word line WL is connected to the gate of the other TFT (right side) as a selection transistor. A specific example of the memory cell MC of this type is shown in FIG. 5(1). The memory cell MC of FIG. 5(1) is a 3T type DRAM cell configured by removing the capacitor from the memory cell MC having the same structure as that of FIG. 4(4) and the other TFT is inserted in the read current path P3 as the selection transistor whose gate is connected to the word line WL.

Figure 6:
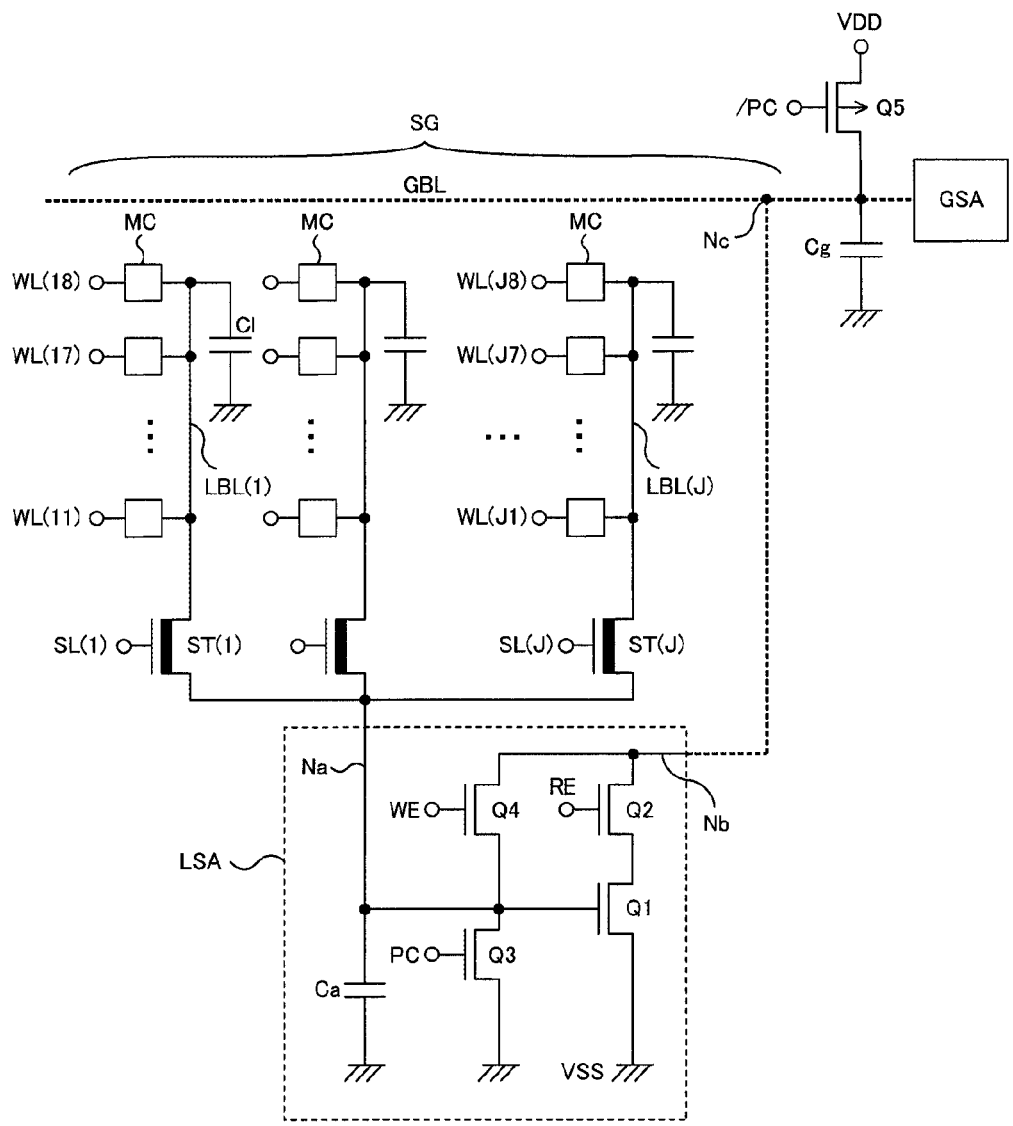
FIG. 6 is a diagram showing a circuit configuration of a portion corresponding to one global bit line and one segment in a multilayer structure of FIG. 2.

Next, configuration and operation of the main part of the memory cell array 10 of FIG. 2 will be described with reference to FIGS. 6 and 7. FIG. 6 shows a circuit configuration of a portion of the multilayer structure of FIG. 2, which corresponds to one global bit line GBL and one segment SG(i). Although a symbol i of the segment SG(i) is omitted in the following description, there are actually N circuits corresponding to segments SG(1) to SG(N) within a range of 1≤i≤N in relation to the one global bit line GBL.

In FIG. 6, there are provided J local bit lines LBL(1) to LBL (J), J switch transistors ST(1) to ST(J), 8J word lines WL (11) to WL (J8), 8J memory cells MC, and one local sense amplifier LSA, respectively corresponding to one segment SG of one global bit line GEL. LBL selecting lines SL(1) to SL(J) are respectively connected to gates of the switch transistors ST(1) to ST(J). Further, there are provided a global sense amplifier GSA (the second circuit) and a pMOSFET Q5 at one end of the one global bit line GBL. In addition, a parasitic capacitance Cg exists on the global bit line GBL and a parasitic capacitance Cl exists on each one local bit line LBL. The global bit line GEL and the global sense amplifier GSA are included in the memory cell array 10.

As described using FIG. 2, eight memory cells MC and one switch transistor ST are connected to each of the J local bit lines LBL(1) to LBL (J). When selecting one of the memory cells MC, one of the J word lines WL connected to the 8J memory cells MC is activated. At this point, when one LBL selecting line SL applied to the gate of one switch transistor ST, the switch transistor ST turns on and one local bit line LBL connected to one memory cell MC corresponding to a selected word line WL is coupled to the input/output node Na of the local sense amplifier LSA. Thereby, data of the memory cell MC corresponding to the selected word line WL is read out to the local bit line LBL, and is inputted to the local sense amplifier LSA (the first circuit) through the switch transistor ST.

The local sense amplifier LSA includes four nMOSFETs Q1, Q2, Q3 and Q4 formed on the silicon substrate SS of FIG. 2. The sensing nMOSFET Q1 has a gate connected to the input/output node Na, and a source connected to a ground potential VSS. The read control nMOSFET Q2 controls a connection between the nMOSFET Q1 and the input/output node Nb in response to a read control signal RE applied to its gate. A pair of these nMOSFETs Q1 and Q2 form a read circuit. The nMOSFET Q3 as a precharge circuit is coupled between the input/output node Na and the grand potential VSS, and a precharge signal PC is applied to its gate. The input/output node Na is precharged to the ground potential VSS when the precharge signal PC is at a high level. The nMOSFET Q4 as a write circuit controls a connection between the one input/output node Na and the other input/output node Nb in response to a write control signal WE applied to its gate. As shown in FIG. 6, a parasitic capacitance Ca exists on the input/output node Na. The parasitic capacitance Ca generally has a small value, for example, smaller than 1 fF.

Meanwhile, the pMOSFET Q5 is coupled between one end of the global bit line GBL and a power supply voltage VDD, and a precharge signal/PC is applied to its gate. The global bit line GBL is precharged to the power supply voltage VDD when the precharge signal/PC is at a low level. Further, the global sense amplifier GSA is a circuit that senses and latches the potential of the global bit line GBL. In a read operation of the memory cell MC, a signal from the local sense amplifier LSA is transmitted to the global sense amplifier GSA through the nodes Nb and Nc. In a write operation of the memory cell MC, data latched by the global sense amplifier GSA is transmitted to the local sense amplifier LSA (the first circuit) through the nodes Nc and Nb. The global sense amplifier GSA may be a part of the data buffer 16 (FIG. 1).

Figure 7:
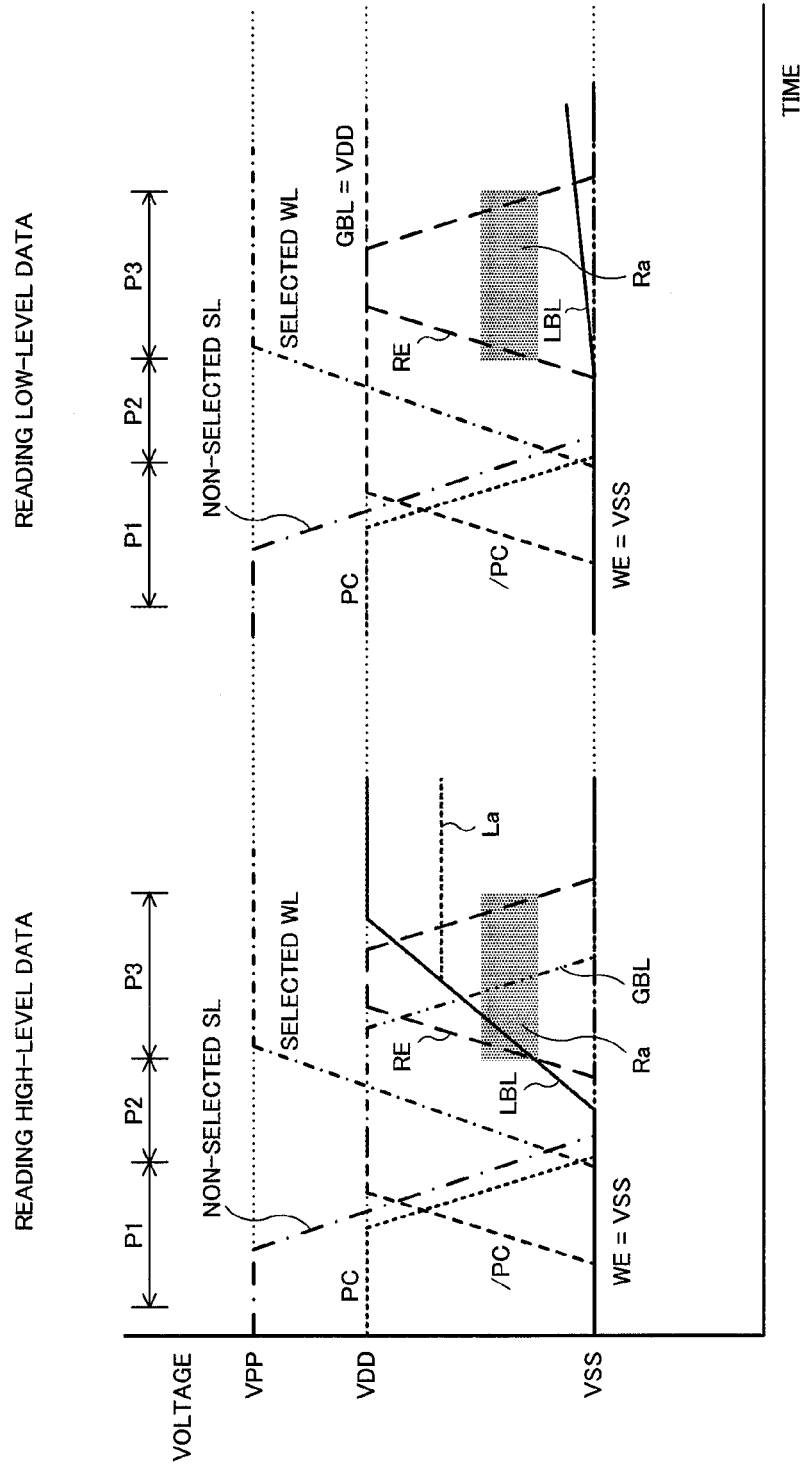
FIG. 7 is an operation waveform diagram in a read operation of the memory cell array of the embodiment.

FIG. 7 shows operation waveforms in a read operation of the memory cell array 10 of the embodiment. Operation waveforms in reading high-level data stored in the memory cell MC are shown in the left side of FIG. 7, and operation waveforms in reading low-level data stored in the memory cell MC are shown in the right side of FIG. 7. Here, a case is assumed where the fixed voltage Vf supplied to the memory cells MC shown in FIG. 2 is set to the power supply voltage VDD (Vf=VDD). Under this assumption, when the high-level data is stored in the memory cell MC, the power supply voltage VDD has been written into the capacitor C0 in the memory cell MC of FIG. 3(1), and the resistance R0 is in a low-resistance state in the memory cell MC of FIG. 3(2). Further, in the memory cells MC of FIGS. 3 and 4, the TFT inserted in the read current path P1 or P2 is in a high-conductance state (threshold voltage Vt is low, or ON-resistance is low). On the other hand, when the low-level data is stored in the memory cell MC, the ground potential VSS has been written into the capacitor C0 in the memory cell MC of FIG. 3(1), and the resistance R0 is in a high-resistance state in the memory cell MC of FIG. 3(2). Further, in the memory cells MC of FIGS. 3 and 4, the TFT inserted in the read current path P1 or P2 is in a low-conductance state (threshold voltage Vt is high, or ON-resistance is high).

In the high-level read operation shown in the left side of FIG. 7, before reaching a precharge cancellation period P1, the global bit line GBL has been precharged to the power supply voltage VDD, and each local bit line LBL and the node Na of the local sense amplifier LSA have been respectively precharged to the ground potential VSS. Then, during the precharge cancellation period P1, the precharge signal /PC is changed from the ground potential VSS to the power supply voltage VDD, and the global bit line GBL becomes floating in a state of being precharged to the power supply voltage VDD. At the same time, the precharge signal PC is changed from the power supply voltage VDD to the ground potential VSS, and each local bit line LBL and the node Na of the local sense amplifier LSA become floating in a state of being precharged to the ground potential VSS.

Further, before reaching the precharge cancellation period P1, respective potentials of the LBL selecting lines SL have been maintained at a boost voltage VPP, and the switch transistors ST are in an ON-state. Then, during the precharge cancellation period P1, LBL selecting lines SL corresponding to non-selected local bit lines LBL are changed from the boost voltage VPP to the ground potential VSS, and corresponding switch transistors ST turn off. Subsequently, during a cell selection period P2, a word line WL corresponding to a selected memory cell MC is driven, and its potential rises from the ground potential VSS to the boost voltage VPP. As a result, the potential of the local bit line LBL begins to rapidly rise, and transitions from the ground potential VSS to the power supply voltage VDD. Here, transition speed of the potential of the local bit line LBL depends on a sum of the parasitic capacitance Cl of the local bit line LBL and the parasitic capacitance Ca of the node Na of the local sense amplifier LSA. The sum of both the parasitic capacitances Cl and Ca is a small value such as 1 fF. However, in consideration that a read current of the high-level data of the memory cell MC is about 100 nA, transition time with which the potential of the local bit line LBL transitions by 1V needs to be about 10 ns, and thus high-speed read operation can be achieved.

During a sensing period P3, the read control signal RE is changed from the ground potential VSS to the power supply voltage VDD, and this state is maintained for a predetermined period. Here, FIG. 7 shows a distribution range Ra (represented by hatching in the figure) of a threshold voltage of the nMOSFET Q1. During the above predetermined period in which the read control signal RE is maintained at the power supply voltage VDD, the nMOSFET Q1 turns on when the potential of the local bit line LBL becomes higher than the upper limit of the distribution range Ra. Thereby, since electric charge stored in the parasitic capacitance Cg of the global bit line GEL is drawn through the nMOSFETs Q2 and Q1, the potential of the global bit line GBL begins to fall, and transitions from the power supply voltage VDD to the ground potential VSS. Thereafter, the potential of the global bit line GEL is latched by the global sense amplifier GSA, and the high-level read operation completes.

Here, assuming the memory cell MC of FIG. 3(1), the potential of the local bit line LBL is determined by a result of charge sharing between the stored charge of the capacitor C0 and the above capacitance value Cl+Ca. In this case, since the capacitance value Cl+Ca is a small value such as about if F, the potential of the local bit line LBL can exceed the upper limit of the distribution range Ra of the threshold voltage of the nMOSFET Q1, as shown using a dashed line La in FIG. 7.

Next, in the low-level read operation shown in the right side of FIG. 7, operations before reaching the precharge cancellation period P1 and operations during the precharge cancellation period P1 are the same as those in the high-level read operation, and thus descriptions thereof will be omitted. Subsequently, during the cell selection period P2, the word line WL corresponding to the selected memory cell MC is driven, and its potential rises from the ground potential VSS to the boost voltage VPP. As a result, the potential of the local bit line LBL begins to gradually rise, and transitions from the ground potential VSS to the power supply voltage VDD. The sum of both the parasitic capacitances Cl and Ca is a small value such as 1 fF, as described above. However, in consideration that a read current of the low-level data is a value such as about 1 nA, which is smaller than the read current of the h-level data, and therefore the transition time with which the potential of the local bit line LBL transitions by 1V needs to be about 1 μs, which is approximately 100 times longer than that in the high-level read operation.

During the sensing period P3, the change of the read control signal RE and the meaning of the distribution range Ra of the threshold voltage of the nMOSFET Q1 are the same as those in the high-level read operation. At this point, during the above predetermined period in which the read control signal RE is maintained at the power supply voltage VDD, the potential of the local bit line LBL remains low, as described above, and thus it does not exceed the lower limit of the distribution range Ra. Therefore, the nMOSFET Q1 is maintained in an OFF-state, the electric charge stored in the parasitic capacitance Cg of the global bit line GEL is not drawn, and thus the potential of the global bit line GEL is maintained at the power supply voltage VDD. Thereafter, the potential of the global bit line GEL is latched by the global sense amplifier GSA, and the low-level read operation completes.

Here, assuming the memory cell MC of FIG. 3(1), the potential of the local bit line LBL is determined by the result of charge sharing between the stored charge of the capacitor C0 and the above capacitance value Cl+Ca, as described above. In this case, even if the capacitance value Cl+Ca is a small value such as about 1 fF, the potential of the local bit line LBL never exceed the lower limit of the distribution range Ra of the threshold voltage of the nMOSFET Q1, as shown in FIG. 7, since the stored charge of the capacitor C0 is approximately zero.

As described above, by employing the configuration of the embodiments, even in a situation where the read current is restricted by using the TFTs in the read current paths of the memory cells MC in the TFT cell layers L1 to L8, the length of the local bit lines LBL including wiring structures extending in the stacking direction can be shortened so that the parasitic capacitance Cl thereof can be sufficiently small. In this case, the thickness of the TFT cell layers L1 to L8 each having a planar structure can be sufficiently thin, as described later, and therefore this can correspondingly contribute to shorten the length of the local bit lines LBL. Thereby, when the signal of each local bit line LBL is transmitted to the local sense amplifier LSA configured using MOSFETs other than TFTs, high-speed operation can be achieved.

Figure 8:
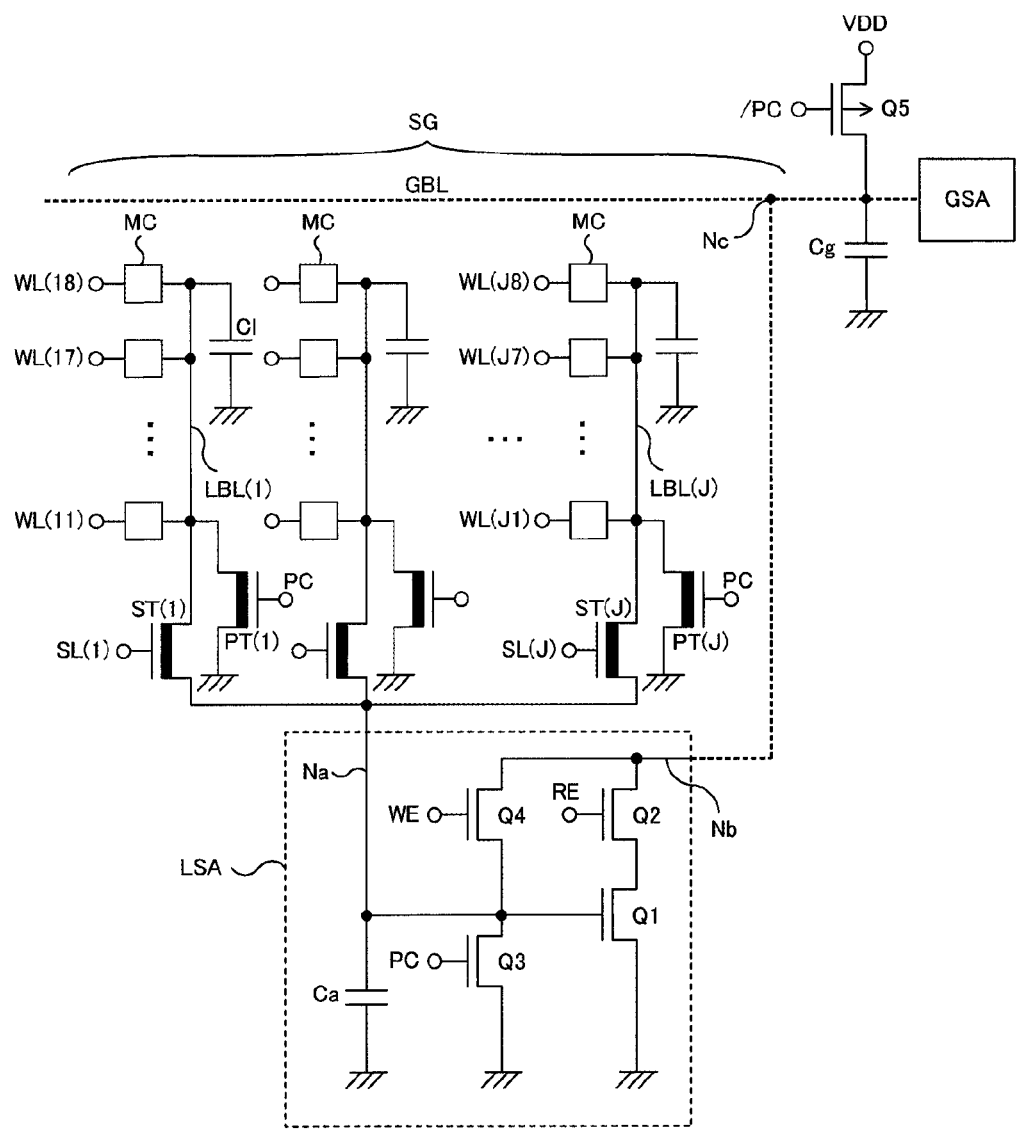
FIG. 8 is a diagram showing a circuit configuration of the same portion as in FIG. 6 in a modification of the memory cell array of the embodiment.

Next, a modification of the memory cell array 10 described using FIGS. 6 and 7 will be described. FIG. 8 shows a circuit configuration of the same portion as in FIG. 6, which is in relation to the modification of the memory cell array 10 of the embodiments. The circuit configuration of FIG. 8 differs from FIG. 6 in that precharge circuits are added to the J local bit lines LBL respectively. That is, precharge transistors PT(1) to PT (J) are formed at one ends of the local bit line LBL(1) to LBL (J) respectively, which have gates to which the precharge signal PC is applied, drains respectively connected to corresponding local bit lines LBL, and sources connected to the ground potential VSS. Thus, when the precharge signal PC is at a high level, the local bit lines LBL are precharged to the ground potential VSS. The precharge transistors PT may be formed, for example, additionally on the TFT selection circuit layer L0 of FIG. 2, or on a separately provided TFT layer.

Figure 9:
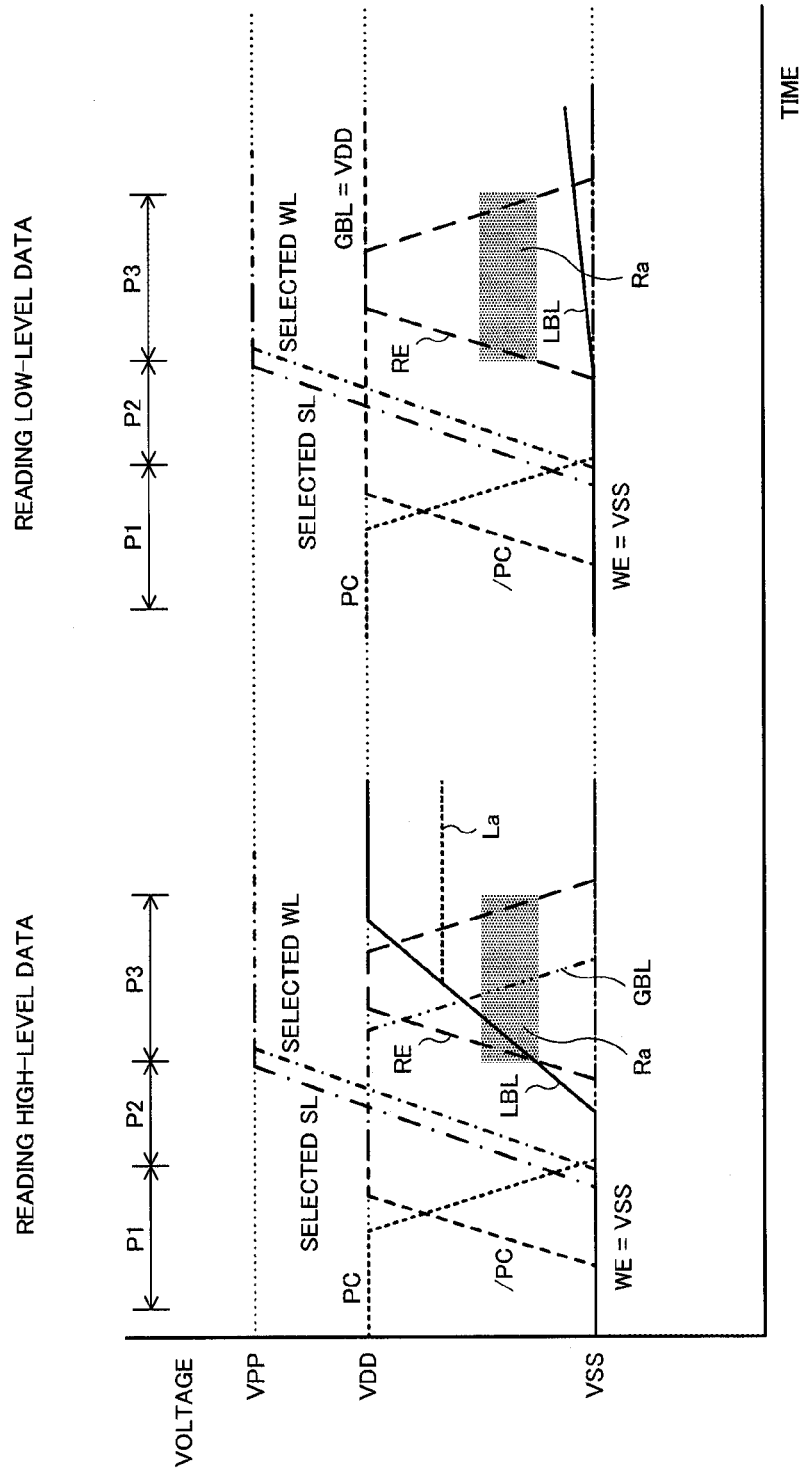
FIG. 9 is an operation waveform diagram in a read operation of the modification of the memory cell array of the embodiment.

FIG. 9 shows operation waveforms in a read operation of the memory cell array 10 of the modification. The operation waveforms of FIG. 9 correspond to FIG. 7, most of which are the same as those in FIG. 7, so different points will be mainly described below. In a high-level read operation shown in the left side of FIG. 9 before reaching the precharge cancellation period P1 and during the precharge cancellation period P1, all the LBL selecting lines SL are maintained at the ground potential VSS so that the switch transistors ST are in the OFF-state, regardless of whether or not the local bit lines LBL are selected, as different from FIG. 7. Meanwhile, before reaching the precharge cancellation period P1, since the precharge signal PC is maintained at the power supply voltage VDD, the respective local bit lines LBL have been precharged to the ground potential VDD by the precharge transistors PT. In addition, before reaching the precharge cancellation period P1 and during the precharge cancellation period P1, other operations are the same as those in FIG. 7.

Subsequently, during the cell selection period P2, a LBL selecting line SL corresponding to a selected local bit line LBL is changed from the ground potential VSS to the boost voltage VPP. From the cell selection period P2 and during the subsequent sensing period P3, other operations are the same as in the high-level read operation of FIG. 7. Thus, as shown in the left side of FIG. 9, the potential of the local bit line LBL begins to rapidly rise, and operation waveforms at this point transit in the same manner as in FIG. 7.

Next, in a low-level read operation shown in the right side of FIG. 9, operations before reaching the precharge cancellation period P1 and operations during the precharge cancellation period P1 are the same as those in the high-level read operation, and thus descriptions thereof will be omitted. Subsequently, during the cell selection period P2, the LBL selecting line corresponding to the selected local bit line LBL is changed from the ground potential VSS to the boost voltage VPP. From the cell selection period P2 and during the subsequent sensing period P3, other operations are the same as in the low-level read operation of FIG. 7. Thus, as shown in the right side of FIG. 9, the potential of the local bit line LBL begins to gradually rise, and operation waveforms at this point transit in the same manner as in FIG. 7.

As described above, in the memory cell array 10 of the modification, the precharge circuits are individually provided for the respective local bit lines LBL, as shown in FIG. 8, and therefore all the LBL selecting lines SL can be controlled into an inactive state (the ground potential VSS) in the precharge period preceding the precharge cancellation period P1. Then, during the precharge cancellation period P1, the precharge signal PC for all the local bit lines LBL need to be in the inactive state, and in contrast, during the cell selection period P2, only one LBL selecting line SL corresponding to the selected local bit line LBL may be set to the boost voltage VPP. Therefore, the operation in FIGS. 6 and 7 may be controlled using a signal amplitude of the boost voltage VPP, and in contrast, the operation in the modification may be controlled using a lower signal amplitude of the power supply voltage VDD, thereby obtaining an effect of correspondingly reducing consumption current.

Here, FIG. 8 shows a case in which the common precharge signal PC is supplied to the precharge circuits (the precharge transistors PT) for the local bit lines LBL. However, precharge signals PC may be individually supplied to the respective precharge circuits for each local bit line LBL, and only a precharge signal PC corresponding to the selected local bit line LBL may be changed from the power supply voltage VDD to the ground potential VSS. Thereby, an effect of further reducing the consumption current can be obtained.

Figure 10:
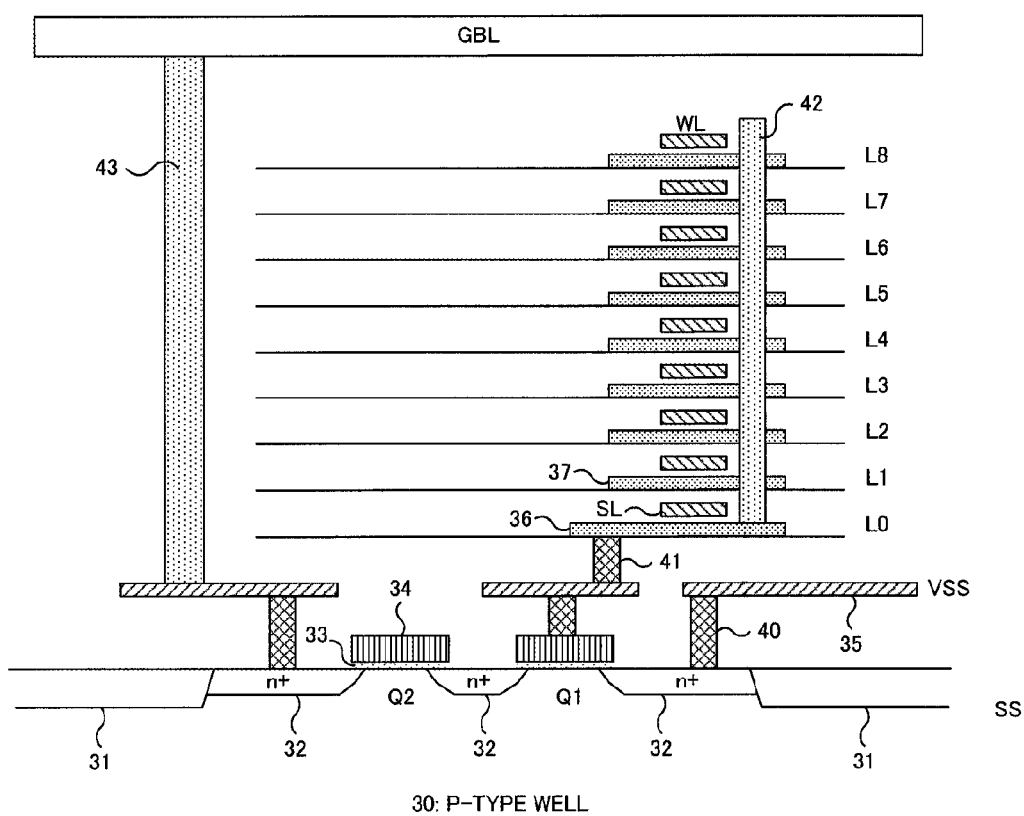
FIG. 10 is a diagram showing a cross-sectional structure of the main part of the memory cell array of FIG. 2.

Next, FIG. 10 shows an example of a cross-sectional structure of the main part of the memory cell array 10 of FIG. 2. There are formed a P-type well 30, element isolation regions 31, and source/drain regions 32 that are n+ regions including n+ type impurity, in a silicon substrate SS as the lowermost layer in the multilayer structure of the semiconductor device. The example of FIG. 10 shows a range where two MOSFETs Q1 and Q2 in the silicon substrate SS are formed. Gate oxide films 33 are formed over the source/drain regions 32 corresponding to the MOSFETs Q1 and Q2, and gate electrodes 34 are formed thereon. A tungsten wiring layer 35 is formed over the gate electrodes 34 via an interlayer insulating film (not shown). The tungsten wiring layer 35 is electrically connected to the gate electrodes 34 and the respective n+ regions of the source/drain regions 32 through contacts 40.

The TFT selection circuit layer L0 is formed over the tungsten wiring layer 35 via the interlayer insulating film. The example of FIG. 10 shows a range where a TFT as the switch transistor ST is formed in the TFT selection circuit layer L0. A source/drain region 36 of the TFT in the TFT selection circuit layer L0 is electrically connected to the tungsten wiring layer 35 through the contacts 40. The TFT cell layers L1 to L8 are stacked in this order over the TFT selection circuit layer L0 respectively via the interlayer insulating film. The example of FIG. 10 shows a range where one TFT of the memory cell MC connected to the local bit line LBL is formed in each of the TFT cell layers L1 to L8. Source/drain regions 37 of the respective TFTs in the TFT cell layers L1 to L8 are located at positions facing the source/drain region 36 in the TFT selection circuit layer L0 in the stacking direction. Further, the LBL selecting lines SL (the gate electrodes) are formed respectively over the source/drain region 36 in the TFT selection circuit layer L0, and the word lines WL (the gate electrodes) are formed respectively over the source/drain regions 37 in the TFT cell layers L1 to L8.

As shown in the right side of FIG. 10, there is formed an eight-layer through contact 42 that penetrates the respective source/drain regions 37 in the eight-layer TFT cell layers L1 to L8, and its lower end reaches the source/drain region 36 in the TFT selection circuit layer L0. This eight-layer through contact 42 functions as the local bit line LBL of FIG. 2. The eight-layer through contact 42 having the structure of FIG. 10 can be formed by forming a contact hole in a one-time photolithography/etching process, and burying conductive material in the contact hole in a one-time CVD process. In this case, for example, polysilicon, tungsten (W), titanium (Ti), titanium nitride (TiN), and a stacked film thereof can be used as the conductive material.

A wiring layer (the third layer) of the global bit lines GBL is formed over the eight-layer TFT cell layers L1 to L8 via the interlayer insulating film. For example, tungsten (W), copper (Cu) and aluminum (Al) can be used as material of the wiring layer of the global bit lines GBL. The respective global bit lines GBL are electrically connected to the tungsten wiring layers 35 through a via 43. For example, tungsten (W) can be used as material of the via 43.

Figure 11:
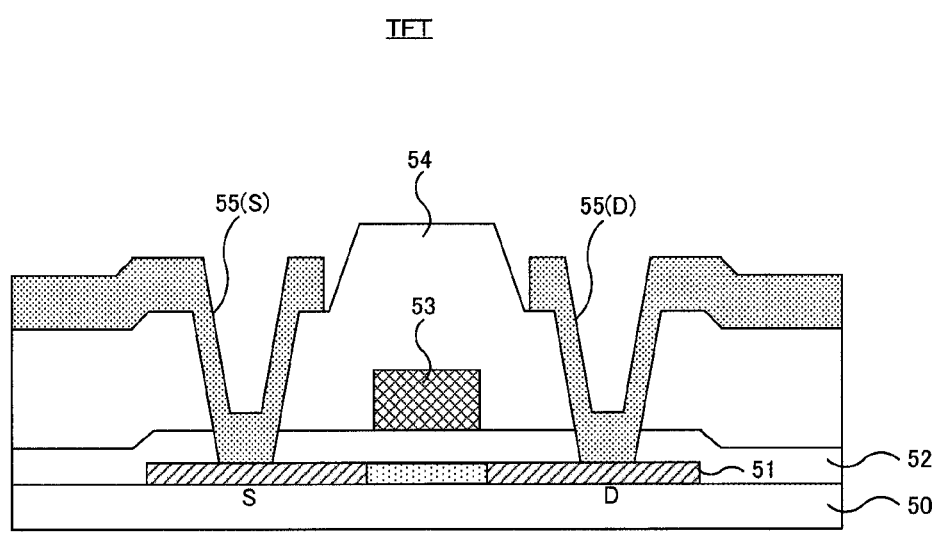
FIG. 11 is a diagram showing a structure example of a TFT formed in each layer in the cross-sectional structure of FIG. 10.

FIG. 11 shows a structure example of the TFT formed in the TFT cell layers L1 to L8 and the TFT selection circuit layer L0. In the TFT shown in FIG. 11, a structure of a source (S) and a drain (D) is formed in a polycrystalline silicon film 51 deposited on a SiO2 film 50, and a gate electrode 53 is formed over a channel between the source and drain via a gate insulating film 52. Impurity such as phosphorus or boron is ion-implanted in high concentration into the source and drain. An interlayer insulating film 54 is formed on the gate electrode 53, and source/drain metals 55 are formed at portions of two contact holes opened in the interlayer insulating film 54. As shown in FIG. 11, the source (S) and one source/drain metal 55(S) are electrically connected to each other, and the drain (D) and the other source/drain metal 55(D) are electrically connected to each other. Here, one of the contacts for the source and drain is formed as the eight-layer through contact 42 that penetrates the source/drain regions 37 of the eight-layer TFT cell layers L1 to L8.

In the TFT shown in FIG. 11, since the channel is formed on the planar polycrystalline silicon film 51, each of the TFT cell layers L1 to L8 and the TFT selection circuit layer L0 can be thin in thickness, thereby it is possible to lower entire height of a portion of the stacked layers. Thus, the length of the local bit lines LBL extending in the stacking direction can be shortened, and the parasitic capacitance and the parasitic resistance can be reduced. Similarly, depth of the via 43 extending downward from the global bit line GBL can be small, and formation process of the via 43 can be simplified so as to improve yield and reliability, and diameter of the via 43 can be small, thereby enabling miniaturization.

In the TFT cell layers L1 to L8 and the TFT selection circuit layer L0, the TFT (the first transistor) made of multicrystalline silicon has a carrier mobility (electron mobility) of, for example, about 30 to 300 $cm^2/Vs$. In addition, the TFT using oxide instead of the multicrystalline silicon has a carrier mobility of, for example, about 5 to 10 $cm^2/Vs$. In contrast, a MOSFET (the second transistor) made of monocrystalline silicon formed on the silicon substrate SS has a carrier mobility of, for example, about 1000 $cm^2/Vs$, which is larger than that of the TFT. Thus, as compared to the MOSFET made of the monocrystalline silicon, resistance per unit cross-sectional area of the TFT is a larger value, and similarly ON-resistance of the TFT is a larger value.

In addition, the MOSFETs (the second transistors) formed on the silicon substrate SS may have a planar structure or a vertical structure. The MOSFETs having the vertical structure includes, for example, FinFET and SGT (Surrounding Gate Transistor). The MOSFETs having the planar structure is advantageous for reducing the thickness of the silicon substrate SS. However, employing the MOSFETs having the vertical structure improves current driving capability per unit layout area, thereby speeding up the circuit operation. Moreover, employing the MOSFETs having the vertical structure can reduce an area of the local sense amplifier LSA of the silicon substrate SS, and thus the parasitic capacitance and the parasitic resistance in the circuits can be reduced, thereby achieving the high-speed operation. Furthermore, the MOSFETs can be mounted together with logic circuits using transistors having higher performance than the planar transistors.

Further, the MOSFETs (the second transistors) are not limited to be formed on the silicon substrate SS as a basic substrate, and can be formed on a predetermined layer located over the silicon substrate SS.

Figure 12A:
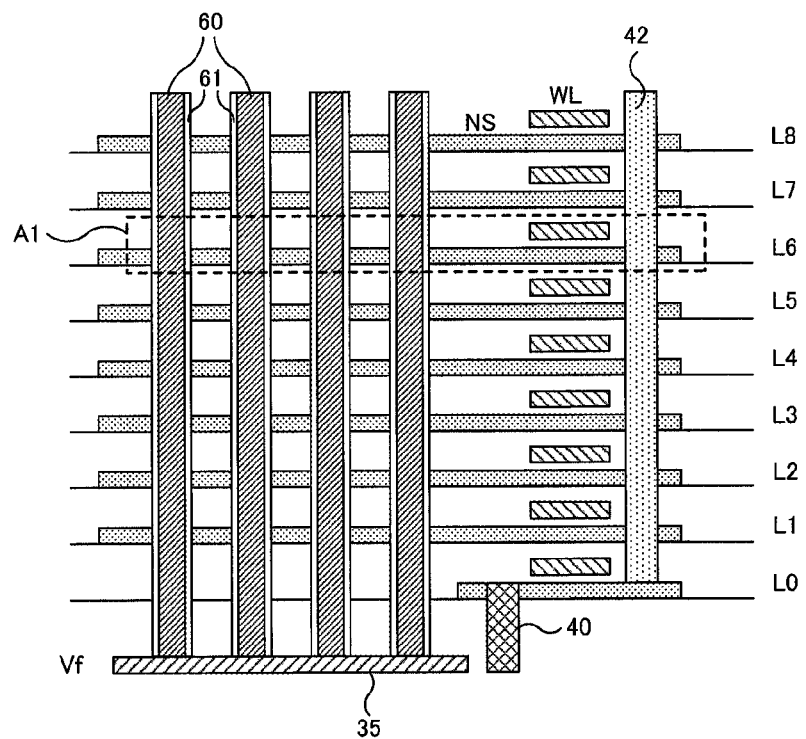
FIGS. 12A and 12B are diagrams showing a first structure example of the memory cell array of the embodiments.
Figure 12B:
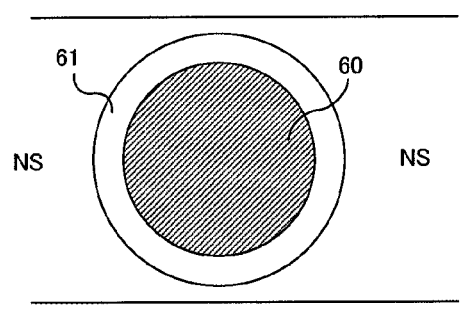

There are various examples of the cross-sectional structure of the memory cell array 10 shown in FIG. 10. In the following, specific examples of the cross-sectional structure of the memory cell array 10 which are different from those in FIG. 10 corresponding to the structures of the memory cell MC with reference to FIGS. 12 to 17. FIGS. 12A and 12B show a first structure example of the memory cell array 10 of the embodiments. The first structure example is applied to a case in which each memory cell MC in the TFT cell layers L1 to L8 is the 1T1C type memory cell MC shown in FIG. 3(1). As to the first structure example, FIG. 12A shows a cross-sectional structure corresponding to a portion including the tungsten wiring layer 35, the TFT selection circuit layer L0 and the TFT cell layers L1 to L8 in the cross-sectional structure of FIG. 10. Here, an area A1 surrounded by a dashed line corresponds to one 1T1C type memory cell. In the first structure example, there are four capacitor structures that penetrate the TFT selection circuit layer L0 and the TFT cell layers L1 to L8 in the stacking direction, in addition to elements of the cross-sectional structure of FIG. 10. FIG. 12B shows a plane view of a portion including the capacitor structures of the cross-sectional structure of FIG. 12A.

Specifically, four cylindrical common electrode materials 60, and high-dielectric constant insulating films 61 surrounding the common electrode materials 60 are respectively formed corresponding to the capacitor C0 of FIG. 3(1). For example, tungsten (W) and titanium nitride (TiN) can be used to form the common electrode materials 60. For example, TiO and STO can be used as material of the high-dielectric constant insulating films 61. Lower ends of the common electrode materials 60 are electrically connected to a line of the fixed voltage Vf (FIG. 3) in the tungsten wiring layer 35. Further, a storage node NS (the source/drain region) of the memory cell MC is formed in each of the TFT cell layers L1 to L8. As understood from the plane view of FIG. 12B, the common electrode material 60 and the storage node NS are opposite to each other via the high-dielectric constant insulating film 61 so that a predetermined capacitance value can be obtained.

Figure 13:
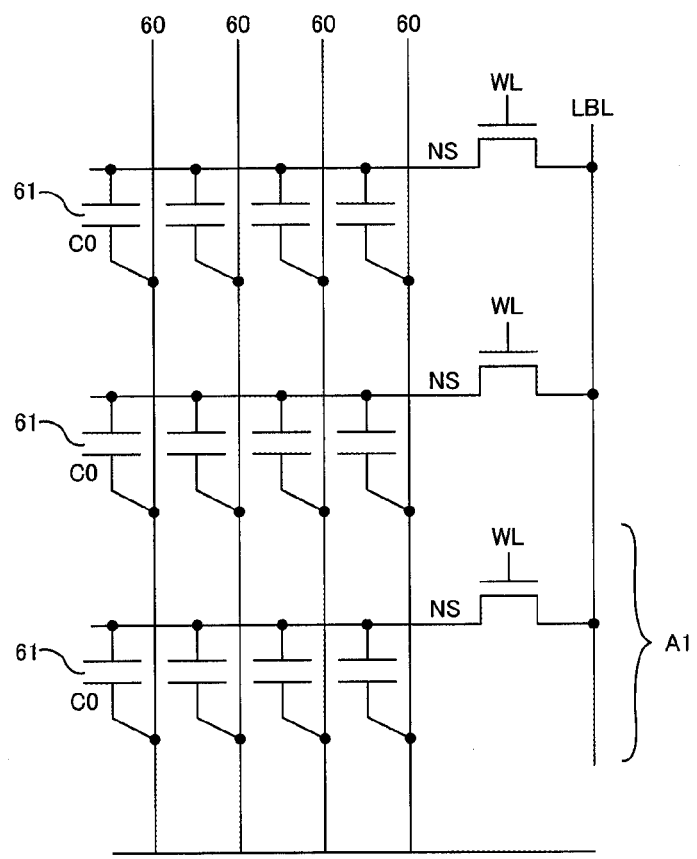
FIG. 13 is a diagram showing a partial equivalent circuit of FIGS. 12A and 12B.

FIG. 13 shows an equivalent circuit of the cross-sectional structure of FIGS. 12A and 12B, and each of the areas A1 of the respective layers of FIG. 12A and an area A1 of FIG. 13 correspond to each other. In an arbitrary area A1, four capacitor portions forming the capacitor C0 of the memory cell MC are connected in parallel, one ends thereof are connected to the common electrode materials 60 respectively, and the other ends thereof are connected to the storage node NS of each layer. In the first structure example, although the four common electrode materials 60 (and the high-dielectric constant insulating films 61) corresponding to the four capacitor portions are formed, the number of the common electrode materials 60 can be appropriately determined according to the capacitance value of the capacitor C0.

As described above, by applying the first structure example of the memory cell array 10, a plurality of capacitors C0 on a plurality of TFT cell layers L1 to L8 can be formed together, and thus it is possible to reduce cost by shortening the manufacturing process.

Figure 14A:
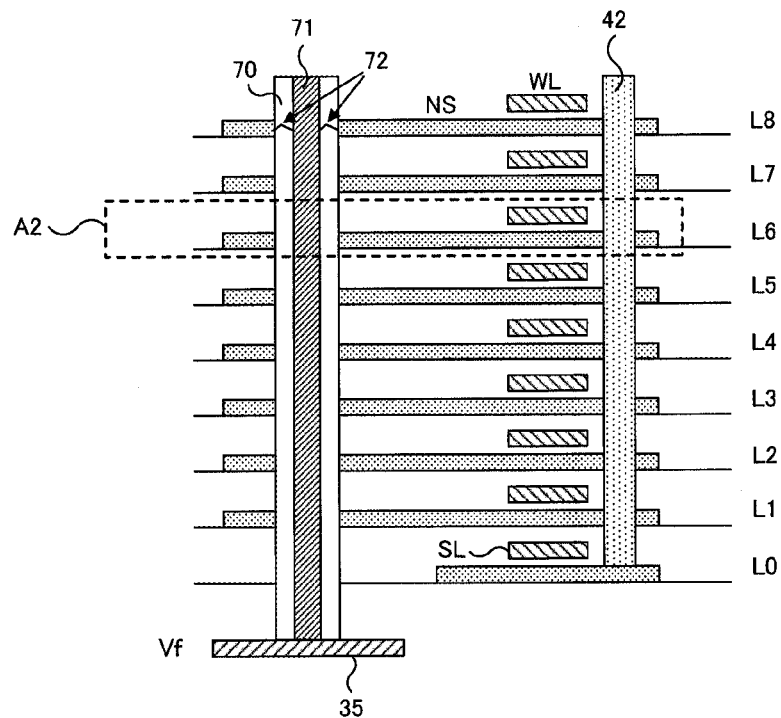
FIGS. 14A and 14B are diagrams showing a second structure example of the memory cell array of the embodiments.
Figure 14B:
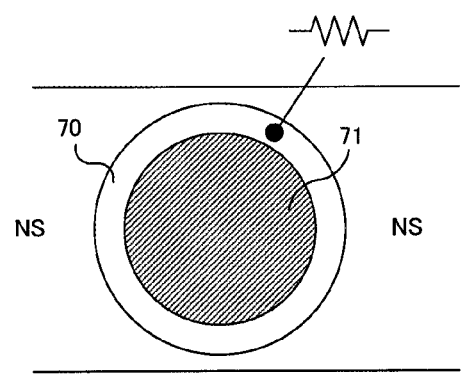

Next, FIGS. 14A and 14B show a second structure example of the memory cell array 10 of the embodiments. The second structure example is applied to a case in which each memory cell MC in the TFT cell layers L1 to L8 is the 1T1R type memory cell MC shown in FIG. 3(2). As to the second structure example, FIG. 14A shows a cross-sectional structure corresponding to the same portion as in FIG. 12A. Here, an area A2 surrounded by a dashed line corresponds to one 1T1R type memory cell. In the second structure example, there is provided a structure corresponding to the resistance R0 (the variable resistance element) of FIG. 3(2) that penetrates the TFT selection circuit layer L0 and the TFT cell layers L1 to L8 in the stacking direction, in addition to elements of the cross-sectional structure of FIG. 10. FIG. 14B shows a plane view of a portion including the structure corresponding to the resistance R0 in the cross-sectional structure of FIG. 14A.

Specifically, there are provided a cylindrical common electrode material 71, and a resistance changing layer 70 surrounding the common electrode material 71, and conductive filaments 72 inside the resistance changing layer 70. For example, tungsten (W) and titanium nitride (TiN) can be used to form the common electrode material 71. For example, oxide of transition metal can be used as material of the resistance changing layer 70. The conductive filaments 72 function as variable resistance paths in the resistance changing layer 70. A lower end of the common electrode material 71 is electrically connected to the line of the fixed voltage Vf in the tungsten wiring layer 35 similarly as in FIG. 12A.

Figure 15:
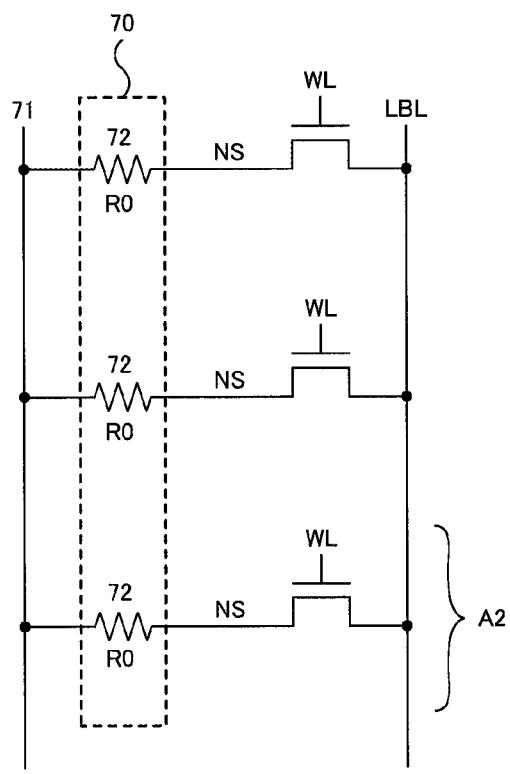
FIG. 15 is a diagram showing a partial equivalent circuit of FIGS. 14A and 14B.

FIG. 15 shows an equivalent circuit of the cross-sectional structure of FIGS. 14A and 14B, and each of the areas A2 of the respective layers of FIG. 14A and an area A2 of FIG. 15 correspond to each other. In an arbitrary area A2, each of the conductive filaments 72 that forms the resistance R0 of the memory cell MC is connected to the common electrode material 71 at one end and is connected to the storage node NS of each layer at the other end.

As described above, by applying the second structure example of the memory cell array 10, a plurality of resistances R0 on the plurality of TFT cell layers L1 to L8 can be formed together, and thus it is possible to reduce cost by shortening the manufacturing process.

Figure 16:
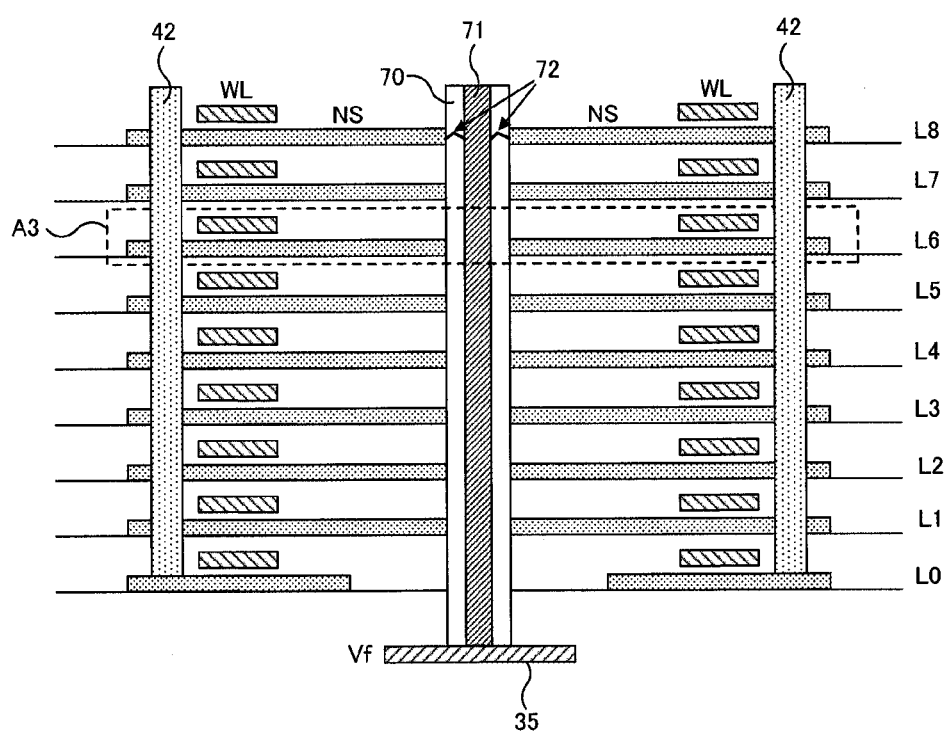
FIG. 16 is a diagram showing a third structure example of the memory cell array of the embodiments.

Next, FIG. 16 shows a third structure example of the memory cell array 10 of the embodiments. The third structure example is a modification of the second structure example. As to the third structure example, FIG. 16 shows a cross-sectional structure corresponding to the same portion as in FIG. 14A. Here, an area A3 surrounded by a dashed line corresponds to two 1T1R type memory cells. In the third structure example, there is a difference from the second structure example of FIGS. 14A and 14B in that one resistance changing layer 70 in each of the TFT cell layers L1 to L8 functions as each of the resistances R0 (the variable resistance elements) of two memory cells MC on both sides. Thus, the common electrode material 71 is formed at the center of the storage nodes NS of the layers of FIG. 16, and elements including the eight-layer through contacts 42, the word lines WL (the gate electrodes) and the like are symmetrically arranged on both sides thereof.

Figure 17:
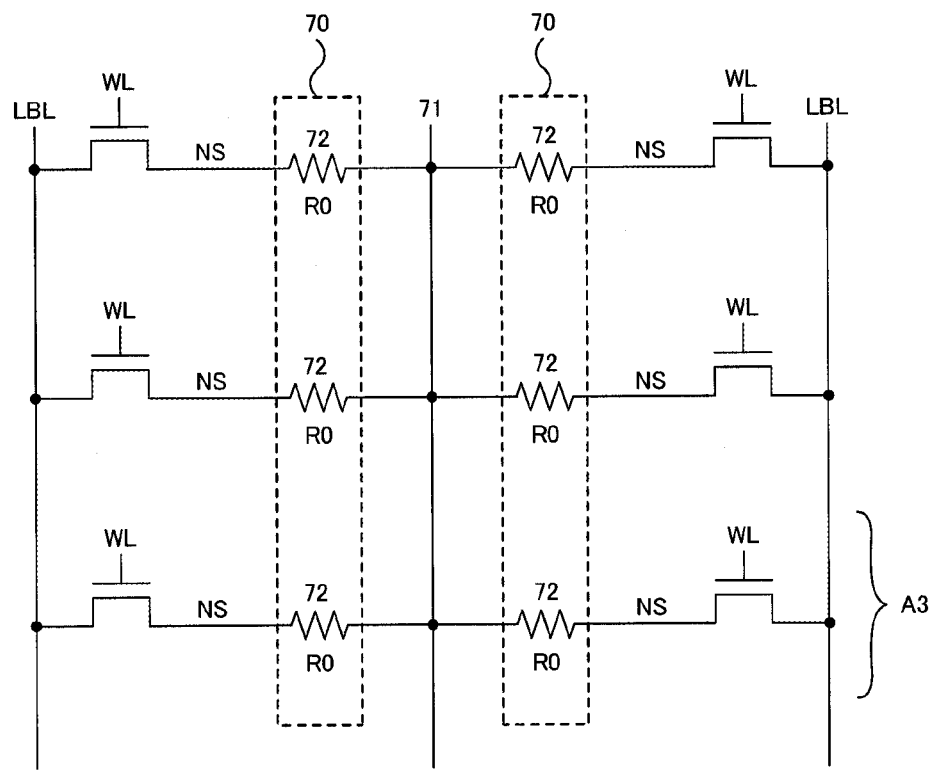
FIG. 17 is a diagram showing a partial equivalent circuit of FIG. 16.

FIG. 17 shows an equivalent circuit of the cross-sectional structure of FIG. 16, and each of the areas A3 of the respective layers of FIG. 16 and an area A3 of FIG. 17 correspond to each other. As shown in FIG. 17, the equivalent circuit of the third structure example is obtained by symmetrically arranging the equivalent circuits (FIG. 15) of the second structure example on both sides of the common electrode material 71. Thus, as to the two memory cells MC formed on both sides in the area A3 of FIG. 17, two conductive filaments 72 formed in the resistance changing layer 70, which is connected to the common electrode material 71, function as the resistances R0 of the different memory cells MC, respectively. In the third structure example, the same effect as the second structure example can be obtained.

Figure 18:
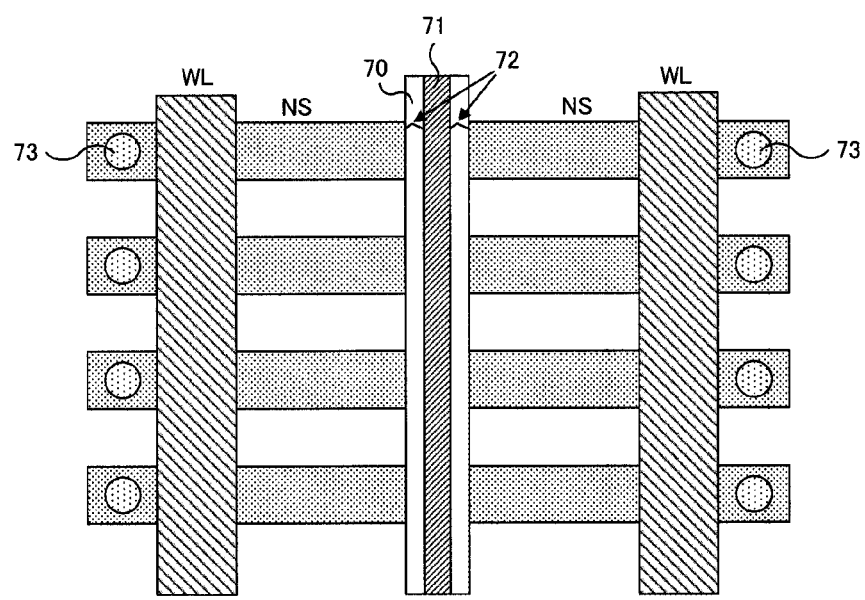
FIG. 18 is a plane view of an arbitrary one of TFT cell layers in the third structure example.

FIG. 18 shows a plane view of an arbitrary one of the TFT cell layers L1 to L8 in the third structure example, in which the common electrode material 71 and the resistance changing layers 70 are formed, each of which is a cuboid (a rectangle in a plane view) that divides a plurality of storage node NS at the center. A plurality of eight-layer through contacts 73 and a plurality of word lines WL are symmetrically arranged with respect to areas on both sides of the respective storage nodes NS. In the third structure example of the memory cell array 10, it is possible to achieve a structure suitable for reducing a cell area, in addition to the same effect as the second structure example.

[Computer System]

Figure 19:
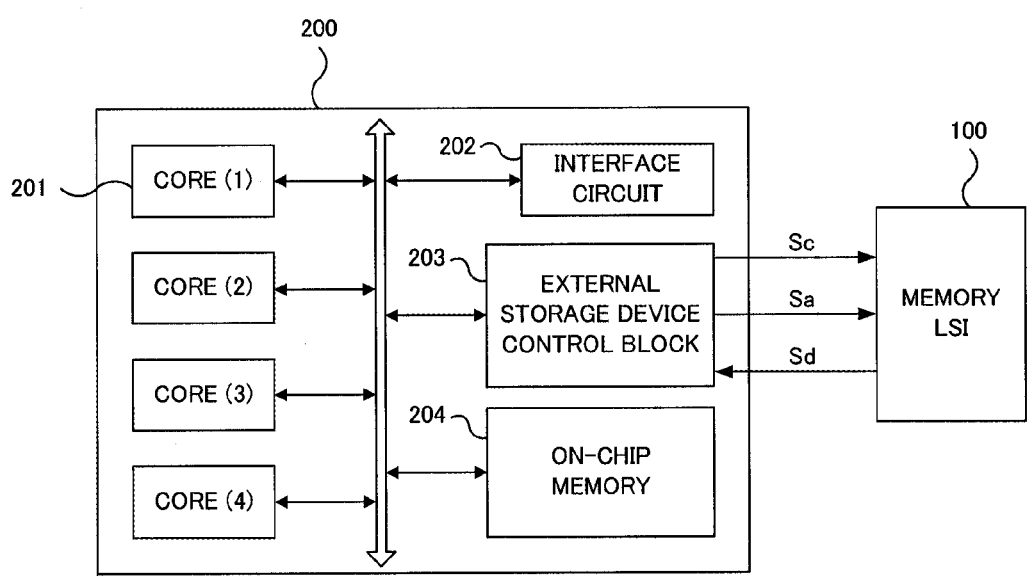
FIG. 19 is a diagram showing a configuration example of a computer system comprising the semiconductor device of the embodiments.

Next, a computer system comprising the semiconductor device of the embodiments will be described with reference to FIG. 19. FIG. 19 is a block diagram showing a configuration example of the computer system comprising a memory LSI 100 as the semiconductor device of the embodiments. In the computer system shown in FIG. 19, a multi-core processor 200 including four processor cores 201 represented as core(1) to core(4), an interface circuit 202, an external storage device control block 203 and an on-chip memory 204 is implemented on a single chip, and the memory LSI 100 of the embodiments is separately implemented on another chip. In the multi-core processor 200 of FIG. 19, access to the memory LSI 100 is controlled by the external storage device control block 203. The external storage device control block 203 sends a command signal Sc and an address signal Sa to the memory LSI 100, and the memory LSI 100 transfers a data signal Sd from/to the external storage device control block 203. By applying the configuration of the embodiments, it is possible to easily achieve the computer system in which the high-speed and large-capacity memory LSI 100 is implemented.

In the foregoing, the preferred embodiments of the invention have been described. However the present invention is not limited to the above embodiments and can variously be modified without departing the essentials of the present invention. Various circuit configurations can be employed for the local sense amplifier LSA and the like without being limited to the configurations described in the embodiments.

The present invention is not limited to the semiconductor device disclosed in the embodiments, and can be applied to various semiconductor devices such as CPU (Central Processing Unit), MCU (Micro Control Unit), DSP (Digital Signal Processor), ASIC (Application Specific Integrated Circuit), ASSP (Application Specific Standard Product) and the like. Further, the present invention can be applied to various devices such as SOC (System on Chip), MCP (Multi Chip Package) and POP (Package on Package) and the like.

Further, transistors of the present invention are field-effect transistors (FETs), and various FETs may be used as the second transistors, such as not only MOS (Metal Oxide Semiconductor) transistors but also MIS (Metal-Insulator Semiconductor) transistors. Further, various FETs such as TFT (Thin Film Transistor) may be used as the first transistors. Further, the device of the invention may include bipolar transistors. Furthermore, an N-channel type transistor (NMOS transistors) is a typical example of a first conductive type transistor, and a P-channel type transistor (PMOS transistor) is a typical example of a second conductive type transistor, respectively as the second transistor.

The material of the resistance element R0 (the resistance element R0 of FIGS. 14 to 18) is disclosed as an example of a non-volatile memory element, and the material may be such that the resistance element R0 (variable resistance element) operates as a volatile memory element.

The present invention can be applied to devices based on various combinations or selections of the disclosure of the embodiments. That is, the present invention covers various modifications which those skilled in the art can carry out in accordance with all disclosures including claims and technical ideas.

The invention claimed is:

1. A semiconductor device comprising:
a plurality of first semiconductor layers, each of the first substrates including a plurality of memory cells and a plurality of bit lines each electrically coupled to associated one or ones of the memory cells, the first semiconductor layers being stacked with each other to provide a stacked structure in which each of the bit lines of a lower one of the first substrates are electrically connected to an associated one of the bit lines of an upper one of the substrates;
a second semiconductor layer including at least one sense amplifier, the sense amplifier including a second transistor that is higher in carrier mobility than the first transistor; and
a third semiconductor layer including at least one selection circuit, the selection circuit including a third transistor that is lower in carrier mobility than the second transistor, the third semiconductor layer being sandwiched between the stacked structure and the second semiconductor layer such that the selection circuit electrically connects the sense amplifier of the second semiconductor layer to a selected one of the bit lines of a lowermost of the first semiconductor layers.

2. The semiconductor device according to claim 1, wherein the first transistor is substantially equal in carrier mobility to the third transistor.

3. The semiconductor device according to claim 1, further comprising a global bit line electrically coupled to the sense amplifier and a global sense amplifier electrically coupled to the global bit line, the bit line of the first semiconductor layer serving as a local bit line, the sense amplifier of the second semiconductor layer serving as a local sense amplifier.

4. The semiconductor device according to claim 3, further comprising a fourth semiconductor layer stacked over the stacked structure, the fourth semiconductor layer including the global bit line.

5. The semiconductor device according to claim 1, wherein each of the bit lines penetrate the first semiconductor layer, and the third semiconductor layer including a penetration electrode penetrating the third semiconductor layer to electrically connect the sense amplifier of the second semiconductor layer to the selected one of the bit lines of the lowermost of the first semiconductor layer.

6. The semiconductor device according to claim 1, wherein each of the memory cells is a volatile memory cell.

7. The semiconductor device according to claim 6, wherein each of the memory cells further includes a capacitor that stores data as electric charge.

8. The semiconductor device according to claim 4, wherein the stacked structure and the third semiconductor layer are sandwiched between the second semiconductor layer and the fourth semiconductor layer.

9. The semiconductor device according to claim 8, further comprising a penetration electrode that penetrates through the stacked structure and the third semiconductor layer to electrically connect the local sense amplifier to the global sense amplifier.

10. The semiconductor device according to claim 4, wherein the fourth semiconductor layer includes the global sense amplifier.

* * * * *